(12) United States Patent
Son

(10) Patent No.: US 12,456,643 B2
(45) Date of Patent: Oct. 28, 2025

(54) SUBSTRATE TREATING APPARATUS AND SUBSTRATE TREATING METHOD

(71) Applicant: SEMES CO., LTD., Cheonan-si (KR)

(72) Inventor: Youngjun Son, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 175 days.

(21) Appl. No.: 18/296,586

(22) Filed: Apr. 6, 2023

(65) Prior Publication Data

US 2024/0030057 A1    Jan. 25, 2024

(30) Foreign Application Priority Data

Jul. 22, 2022   (KR) .................. 10-2022-0091154

(51) Int. Cl.
*H01L 21/687*  (2006.01)
*H01L 21/67*   (2006.01)

(52) U.S. Cl.
CPC .. *H01L 21/68742* (2013.01); *H01L 21/67103* (2013.01); *H01L 21/67288* (2013.01); *H01L 21/6875* (2013.01); *H01L 21/68757* (2013.01)

(58) Field of Classification Search
CPC ......... H01L 21/68742; H01L 21/67103; H01L 21/67288; H01L 21/6875; H01L 21/68757; H01L 21/67109; H01L 21/67178; H01L 21/67248; H01L 21/6838; H01L 21/68771; H01L 21/67011; H01L 21/67259; H01L 21/68785
See application file for complete search history.

(56) References Cited

U.S. PATENT DOCUMENTS

| | | |
|---|---|---|
| 10,860,148 B2 | 12/2020 | Sun et al. |
| 2010/0126962 A1* | 5/2010 | Lee ............... H01L 21/6875 |
| | | 156/345.55 |
| 2022/0283505 A1 | 9/2022 | Schreuder et al. |

FOREIGN PATENT DOCUMENTS

| | | | |
|---|---|---|---|
| JP | 2013-191601 | | 9/2013 |
| JP | 2013191601 A | * | 9/2013 |
| KR | 10-1768648 B1 | | 8/2017 |
| KR | 10-2021-0133556 A | | 11/2021 |
| KR | 10-2022-0047283 A | | 4/2022 |

OTHER PUBLICATIONS

English translation JP2013191601 (Year: 2013).*
Highly stretchable, transparent ionic touch panel.
1 Office Action for Korean Application No. 10-2022-0091154 dated Apr. 25, 2024.

* cited by examiner

*Primary Examiner* — Jason L Vaughan
*Assistant Examiner* — Amanda Kreiling
(74) *Attorney, Agent, or Firm* — Harness, Dickey & Pierce, P.L.C.

(57) ABSTRACT

A substrate treating apparatus includes a support plate having a first decompression hole and a second decompression hole in a first surface facing a substrate and including a first decompression flow path connected to the first decompression hole and a second decompression flow path connected to the second decompression hole, a plurality of movable pins protruding from the first surface of the support plate and configured to contact a conductive line according to movement in a first direction, and a controller configured to adjust an order of decompressing the first decompression flow path and the second decompression flow path.

19 Claims, 13 Drawing Sheets

SUBSTRATE TREATING APPARATUS AND SUBSTRATE TREATING METHOD

CROSS-REFERENCE TO RELATED APPLICATION

This application is based on and claims priority under 35 U.S.C. § 119 to Korean Patent Application No. 10-2022-0091154, filed on Jul. 22, 2022, in the Korean Intellectual Property Office, the disclosure of which is incorporated by reference herein in its entirety.

BACKGROUND

1. Field

The disclosure relates to a substrate treating apparatus and a substrate treating method. More particularly, the disclosure relates to an apparatus for treating a warped substrate and a method for treating a warped substrate.

2. Description of the Related Art

Semiconductor devices are manufactured by depositing various materials in the form of thin films on a substrate and patterning the deposited materials. To this end, different substrate treatment processes of several stages, such as deposition and etching, are performed.

A substrate may be seated on a support plate and processed. The substrate may be provided on the support plate in a warped state, and methods for seating a warped substrate on a support plate without damage have been studied.

SUMMARY

Provided is a substrate treating apparatus having improved reliability.

Additional aspects will be set forth in part in the description which follows and, in part, will be apparent from the description, or may be learned by practice of the presented embodiments of the disclosure.

According to an aspect of the disclosure, a substrate treating apparatus is provided. The substrate treating apparatus includes: a support plate having a first decompression hole and a second decompression hole on a first surface facing a substrate and including a first decompression flow path connected to the first decompression hole and a second decompression flow path connected to the second decompression hole, a plurality of movable pins protruding from the first surface of the support plate and configured to contact a conductive line according to movement in a first direction, and a controller configured to adjust an order of decompressing the first decompression flow path and the second decompression flow path, wherein the controller is further configured to determine the order of decompressing the first decompression flow path and the second decompression flow path according to a distance between the first decompression hole and a first contact pin which is selected from the plurality of movable pins and comes into contact with the conductive line first and a distance between the second decompression hole and the first movable pin.

The first decompression flow path may be separated from the second decompression flow path.

The substrate treating apparatus may further include a plurality of pin holes passing through a portion of the support plate and accommodating the plurality of movable pins and a line tunnel connected to the plurality of pin holes, wherein the conductive line extends within the line tunnel.

The conductive line may be insulated from the support plate.

A position of the movable pin that first comes into contact with the conductive line, among the plurality of movable pins, may be specified by a capacitive touch sensing method.

The plurality of movable pins may include a head portion configured to support the substrate, a tail portion configured to contact the conductive line according to the movement in the first direction, and a body portion between the head portion and the tail portion, wherein the head portion and the tail portion include a conductive material, and the body portion includes a dielectric material.

At least one of the head portion and the tail portion may include polyether ether ketone including a conductive carbon-based filler.

The plurality of movable pins may further include an elastic member configured to apply elastic force in a direction opposite to the first direction.

The substrate treating apparatus may further include a plurality of fixed pins protruding from the first surface of the support plate and configured to support the substrate.

The support plate may further include a cooling flow path therein.

According to another aspect of the disclosure, a substrate treating apparatus is provided. The substrate treating apparatus includes an upper plate including a first surface facing a substrate and including a center portion and an edge portion and a second surface opposite to the first surface, having a first decompression hole and a first pin hole in the center portion of the first surface, and having a second decompression hole and a second pin hole at the edge portion of the first surface, a lower plate disposed on the second surface of the upper plate and defining a line tunnel connecting the first pin hole to the second pin hole together with the upper plate, a first movable pin located in the first pin hole, protruding from the first surface, and configured to move in a first direction, a second movable pin located in the second pin hole, protruding from the first surface, and configured to move in the first direction, a plurality of fixed pins protruding from the first surface, a conductive line located in the line tunnel and configured to contact the first and second movement pins according to movement of the first and second movement pins in the first direction, a sensor configured to sense a contact order of the first movable pin with the conductive line and the second movable pin with the conductive line, and a controller configured to adjust a decompression order of the first decompression hole and the second decompression hole according to a contact order of the first movable pin and the second movable pin with the conductive line.

The upper plate further may include a first decompression flow path connected to the first decompression hole and a second decompression flow path connected to the second decompression hole, the first decompression flow path may be separated from the second decompression flow path, and the first decompression flow path and the second decompression flow path may be individually decompressed by the controller.

The substrate treating apparatus may further include an insulating layer disposed between the upper plate and the lower plate.

Upper surfaces of the first movable pin and the second movable pin may be farther from the first surface of the upper plate than upper surfaces of the plurality of fixed pins.

According to another aspect of the disclosure, a substrate treating method is provided. The substrate treating method includes sensing a position of a first region, which is a portion of the support plate that first comes into contact with the substrate and decompressing a second region other than the first region after decompressing the first region.

the sensing of the position of the first region may include moving the movable pin of the first region in a first direction, while supporting the substrate, contacting the movable pin with a conductive line, and determining a position of the first region by sensing a contact point at which the movable pin contacts the conductive line.

The substrate treating method may further include supporting the substrate by a fixed pin as the movable pin moves in the first direction.

A time interval between a time point of decompressing the first region and a time point of decompressing the second region may range from about 0.05 seconds to about 1 second.

The substrate may be upwardly convex with respect to a surface parallel to an upper surface of the support plate, and the first region may be an edge portion of the support plate.

The substrate may be downwardly convex with respect to a surface parallel to an upper surface of the support plate, and the first region may be a center portion of the support plate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
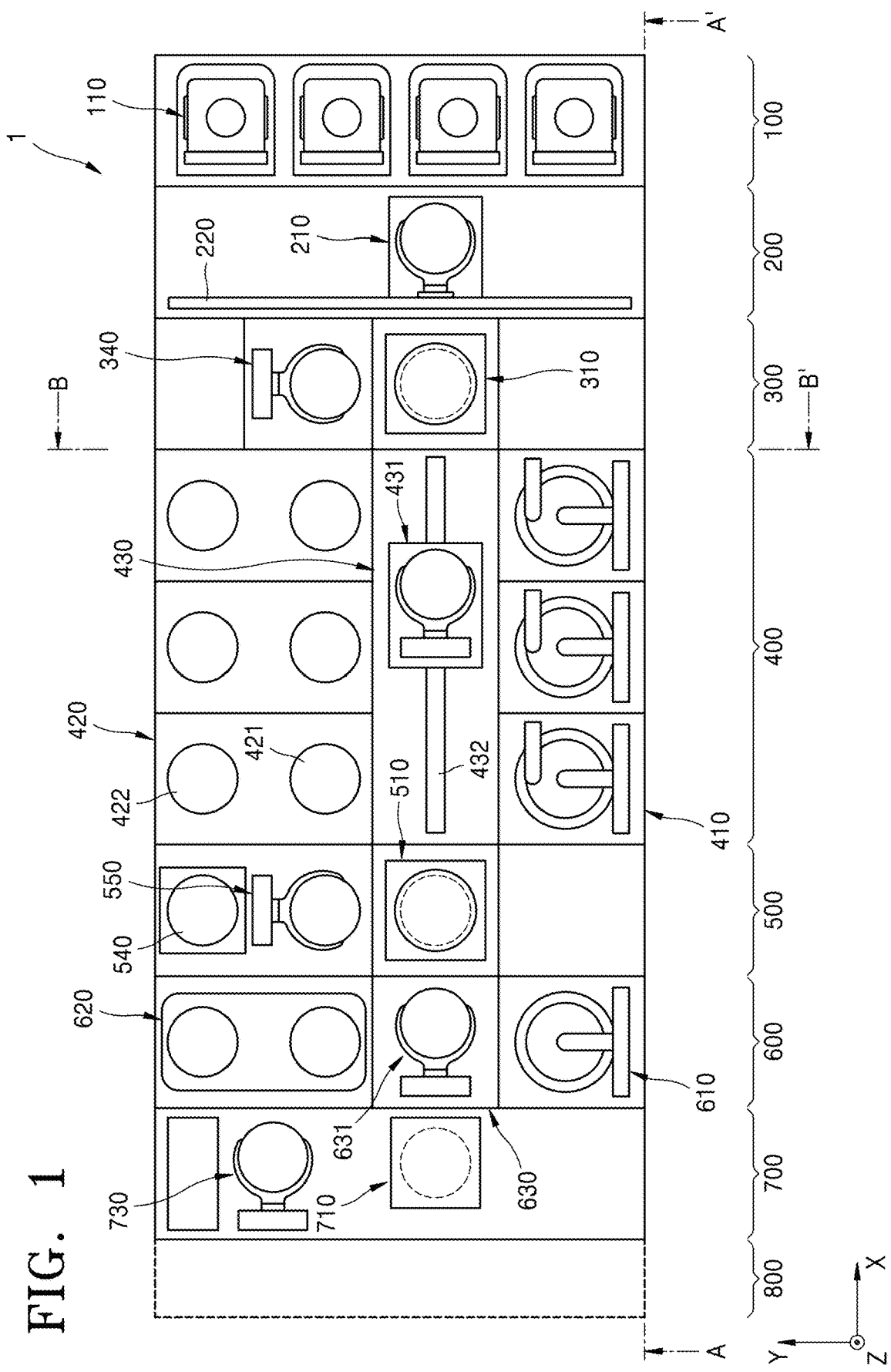
FIG. 1 is a plan view of a substrate treatment facility for explaining a substrate treating apparatus according to embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions, such as "at least one of," when preceding a list of elements, modify the entire list of elements and do not modify the individual elements of the list.

Hereinafter, embodiments of the disclosure are described in detail with reference to the accompanying drawings. The same reference numerals are used for the same components in the drawings, and redundant descriptions thereof are omitted.

Figure 2:
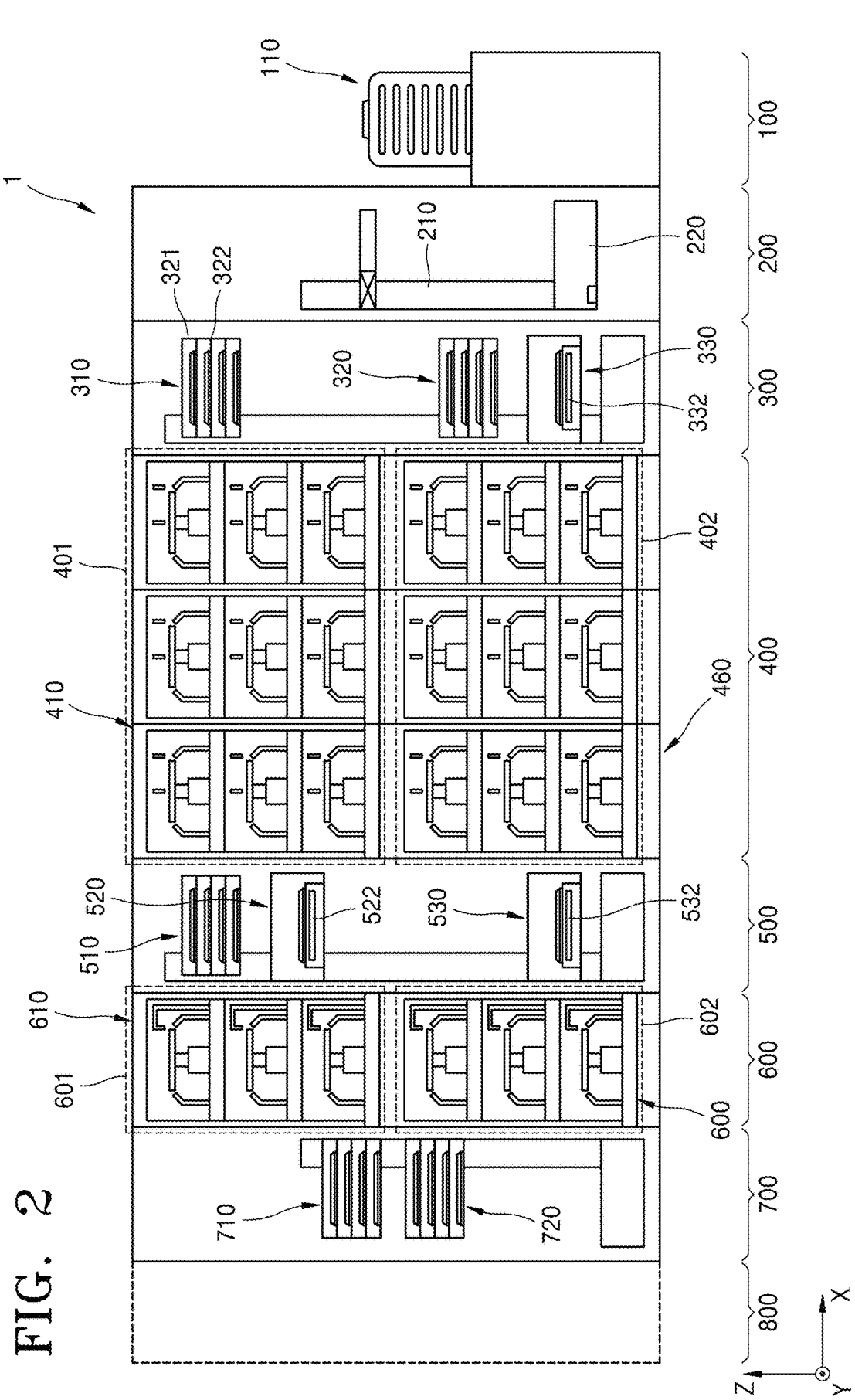
FIG. 2 is a side view of the substrate treatment facility of FIG. 1 viewed in a direction A-A'.
Figure 3:
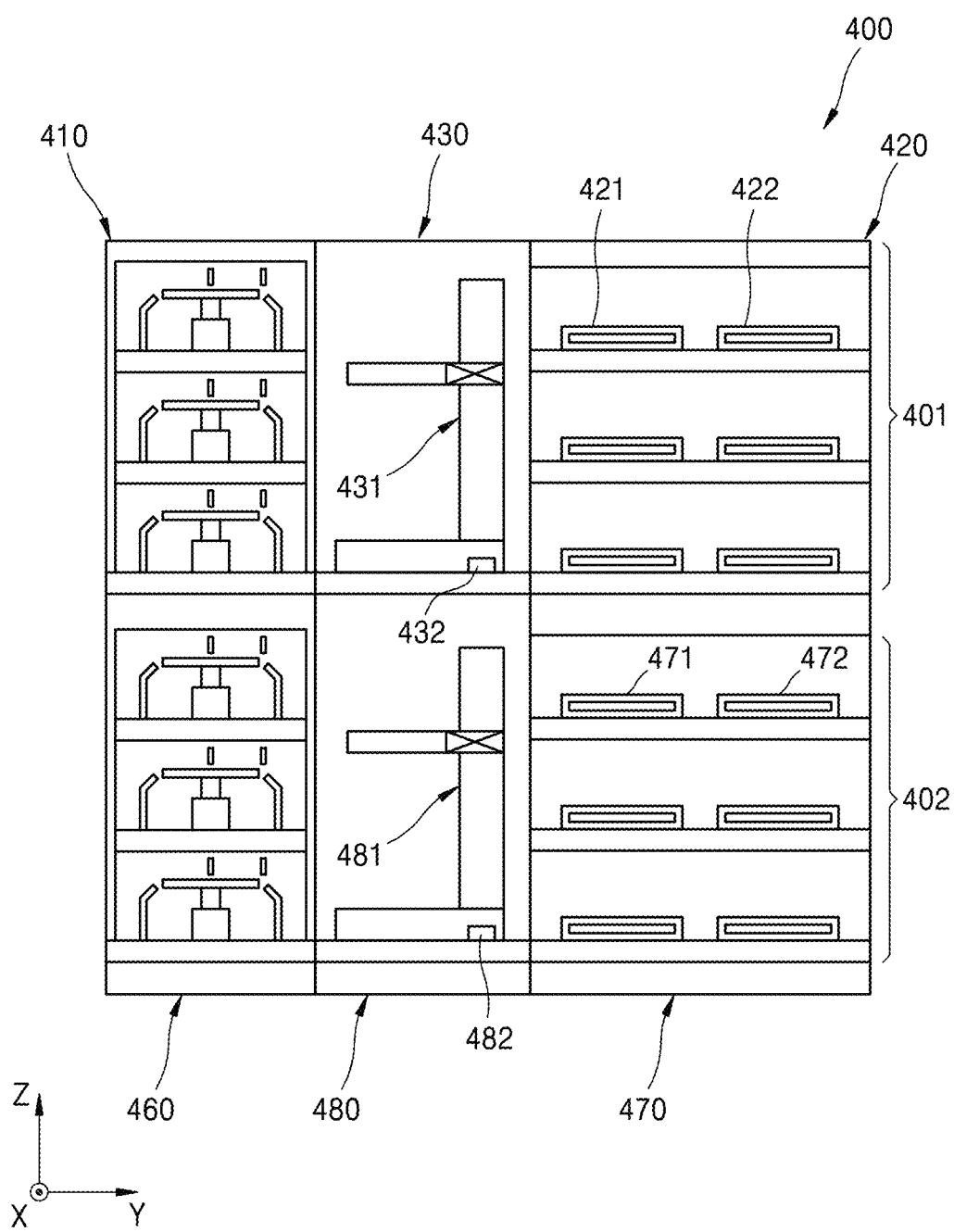
FIG. 3 is a side view of the substrate treatment facility of FIG. 1 viewed in the direction B-B'.

FIG. 1 is a top view of a substrate treatment facility 1 according to embodiments, and FIGS. 2 and 3 show the substrate treatment facility 1 according to FIG. 1 in directions A-A' and B-B', respectively.

Referring to FIGS. 1 to 3, the substrate treatment facility 1 may include a load port 100, an index module 200, a first buffer module 300, a first process module 400, a second buffer module 500, a second process module 600, and an interface module 700.

The load port 100 may be configured to accommodate containers 110 in which a substrate S is stored. For example, the containers 110 may be front opening unified pods (FOUPs). The containers 110 may be imported from the outside to the load port 100 or exported from the load port 100 to the outside by an overhead hoist transfer (OHT).

The index module 200 may transfer the substrate S between the containers 110 accommodated in the load port 100 and the first buffer module 300. The index module 200 may include an index robot 210 and an index rail 220. The index robot 210 may move along the index rail 220 to a position adjacent to the container 110 accommodated in the load port or the first buffer module 300.

The first buffer module 300 may include a first buffer 310, a second buffer 320, a first cooling chamber 330, and a first buffer robot 340. The first buffer 310 and the second buffer 320 may temporarily store a substrate transferred from the index module 200 to the first process module 400 or from the first process module 400 to the index module 200.

The first buffer 310 may be disposed at a height corresponding to an application module 401 of the first process module 400 to be described below. The second buffer 320 and the first cooling chamber 330 may be disposed at a height corresponding to that of a developing module 402 of the first process module 400 to be described below.

The first buffer robot 340 may transfer the substrate S between the first buffer 310 and the second buffer 320. The first cooling chamber 330 may include a first cooling plate 332 configured to cool the substrate S. The substrate S of the first cooling chamber 330 may be carried in or out by the index robot 210 or a developing robot 481 of the developing module 402 to be described below.

The first process module 400 may include the application module 401 and the developing module 402. The application module 401 may be configured to perform a process of applying a photoresist to the substrate S and a heat treatment process of heating or cooling the substrate S before and after the application process.

The application module 401 may include resist application chambers 410, first bake chambers 420 and a first transfer chamber 430.

The first transfer chamber 430 may transfer the substrate S among the first buffer module 300, the application module 401 and the second buffer module 500. The first transfer chamber 430 may include an application portion robot 431 and an application portion rail 432. The application portion robot 431 may move to a position adjacent to the resist application chambers 410, the first bake chambers 420, the first buffer module 300, and the second buffer module 500 disposed to be adjacent to each other along the application portion rail 432. The resist application chambers 410 and the first bake chambers 420 may be disposed on the side of the first transfer chamber 430. For example, the resist application chambers 410 may be apart from the first bake chambers 420 with the first transfer chamber 430 therebetween.

The first bake chambers 420 may heat-treat the substrate S. For example, the first bake chamber 420 may include a second cooling plate 421 and a first heating plate 422. For example, the first bake chamber 420 may be configured so that a pre-bake process of removing organic substances or moisture from a surface of the substrate S or a soft bake process to be performed after applying a coating solution onto the substrate S are performed.

In order to form a pattern on the substrate S, the developing module 402 may be configured to perform a developing process of supplying a developing solution to remove a portion of the photoresist and a heat treatment process of heating or cooling the substrate S before and after the developing process.

The developing module 402 may include developing chambers 460, second bake chambers 470, and a second transfer chamber 480.

The second transfer chamber 480 may transfer the substrate S among the first buffer module 300, the developing module 402, and the second buffer module 500. The second transfer chamber 480 may include a developing robot 481 and a developing portion rail 482. The developing robot 481 may move to a position adjacent to the developing chambers 460, the second bake chambers 470, the first buffer module 300, and the second buffer module 500 disposed adjacent to each other along the developing rail 482. The developing chambers 460 and the second bake chambers 470 may be disposed on the side of the second transfer chamber 480. For example, the developing chambers 460 and the second bake chambers 470 may be apart from each other with the second transfer chamber 480 therebetween.

The second bake chambers 470 may be configured to heat or cool the substrate S. For example, the second bake chambers 470 may include third cooling plates 471 and second heating plates 472.

The second buffer module 500 may be configured to transport the substrate S between the first process module 400 and the second process module 600, or to perform an edge exposure process and a cooling process on the substrate S.

The second buffer module 500 may include a third buffer 510, a second cooling chamber 520, a third cooling chamber 530, an edge exposure chamber 540, and a second buffer robot 550. The third buffer 510, the second cooling chamber 520, and the edge exposure chamber 540 may be disposed at a height corresponding to the application module 401. The third cooling chamber 530 may be disposed at a height corresponding to the developing module 402.

The second cooling chamber 520 and the edge exposure chamber 540 may be configured to perform a subsequent process on the substrate S subjected to a process performed in the application module 401. For example, the second cooling chamber 520 may include a fourth cooling plate 522 configured to cool the substrate S subjected to a process performed in the application module 401. The edge exposure chamber 540 may be configured to expose the edge E of the substrate S subjected to the cooling process performed in the second cooling chamber 520.

The third buffer 510 may be configured to temporarily store the substrate S on which a process has been performed in the edge exposure chamber 540 before the substrate S is transported a preprocessing module 601 to be described below.

The third cooling chamber 530 may be configured to cool the substrate S subjected to a process performed in the post-processing module 602 to be described below before the substrate S is transported to the developing module 402. For example, the third cooling chamber 530 may include a fifth cooling plate 532 configured to cool the substrate S.

The second process module 600 may be configured to perform a process of applying a composition for forming a protective film protecting a resist film formed on the substrate S, a process of cleaning the substrate S, or a process of baking the substrate S. The second process module 600 may include a pre-exposure processing module 601 and a post-exposure processing module 602.

The interface module 700 may be configured to transfer the substrate S between the second process module 600 and an exposure device 800. The exposure device 800 may be configured to perform a lithography process. For example, the exposure device 800 may include liquid immersion lithography equipment or extreme ultraviolet (EUV) exposure equipment.

According to embodiments, a substrate treating apparatus 900 may be provided as an example of the cooling plates 332, 421, 471, 522, and 532. However, the disclosure is not limited thereto, and the substrate treating apparatus 900 may include heating plates 422 and 472.

Figure 4:
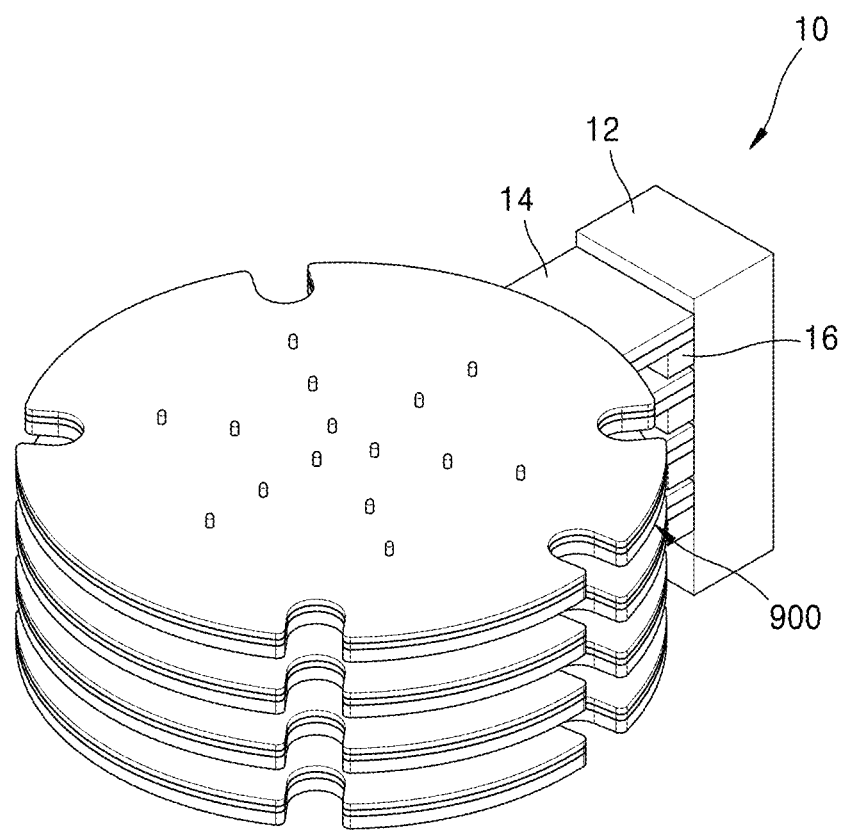
FIG. 4 is a perspective view illustrating a substrate treating apparatus according to some embodiments.

FIG. 4 is a perspective view illustrating a plate assembly 10 including a plurality of substrate treating apparatuses 900 according to some embodiments.

Referring to FIG. 4, the plate assembly 10 may include a plurality of substrate treating apparatuses 900, a connection block 12, a fastening portion 14 and a support portion 16. The plate assembly 10 may be provided in a chamber in which a heat treatment process is performed. For example, the cooling chambers 330, 520, and 530 and the bake chambers 420 and 470 may include the plate assembly 10.

According to embodiments, the substrate treating apparatuses 900 may be connected to the connection block 12 through the fastening portion 14 and may be stacked in a vertical direction (e.g., a Z direction). The substrate treating apparatuses 900 may be arranged to be apart from each other in the vertical direction. The support portion 16 may be configured to distribute stress applied to the fastening portion 14.

According to embodiments, the connection block 12 may house members extending into the substrate treating apparatuses 900. For example, a decompression flow path (or a pressure reducing flow path) 944, a cooling flow path 954, and a conductive line 924 described below may be housed in the connection block 12.

Figure 5:
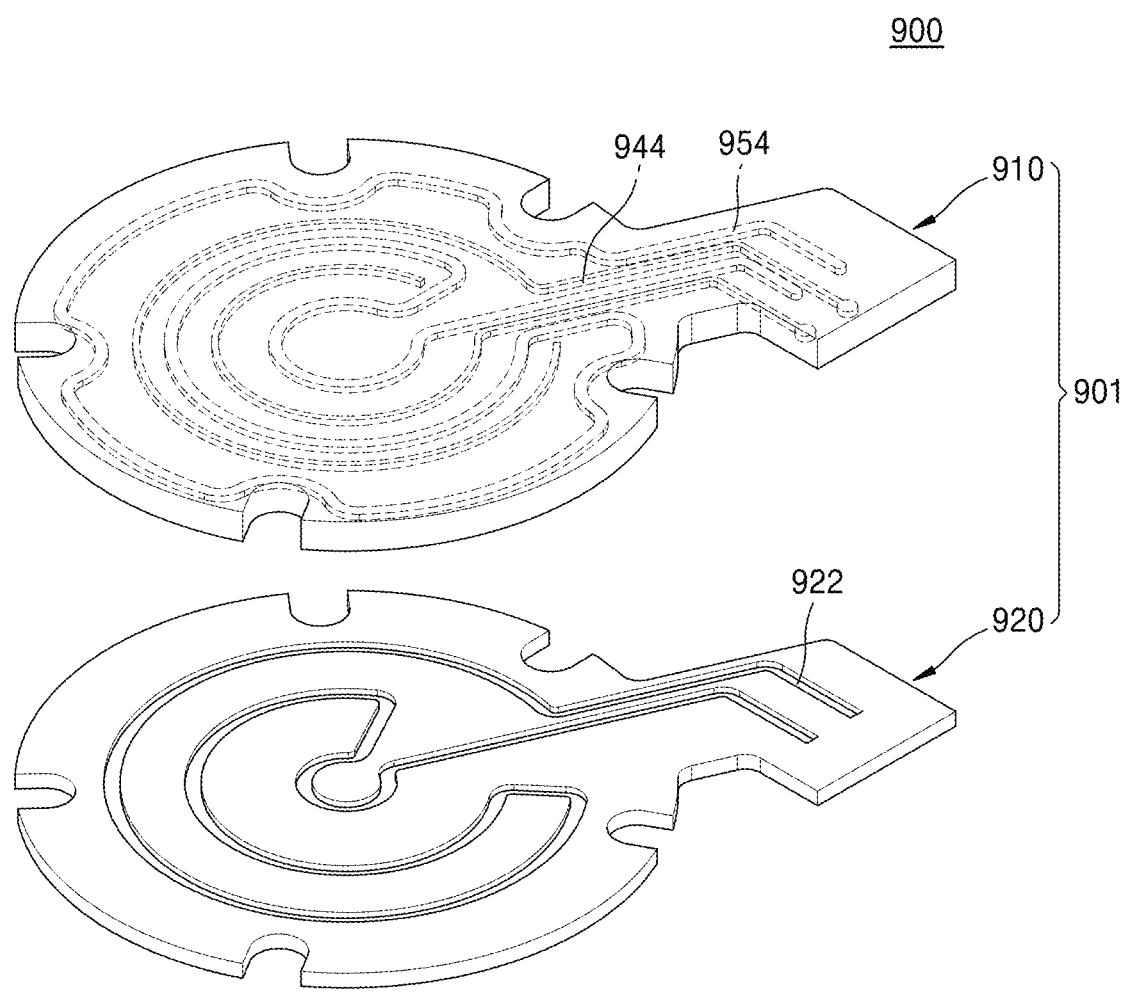
FIG. 5 is a perspective view illustrating a support plate of a substrate treating apparatus according to some embodiments.
Figure 6:
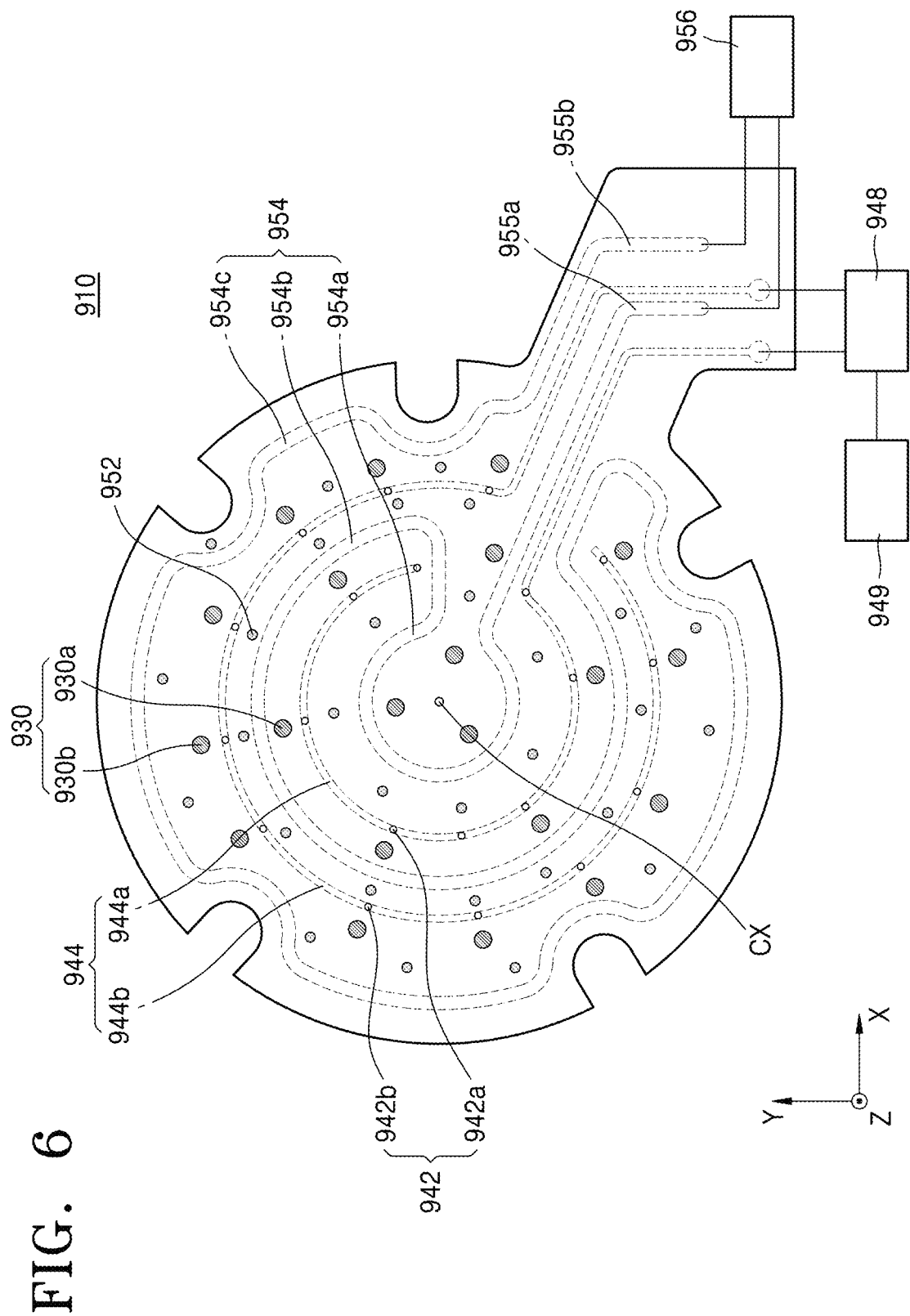
FIG. 6 is a plan view illustrating an upper plate of a substrate treating apparatus according to some embodiments.
Figure 7:
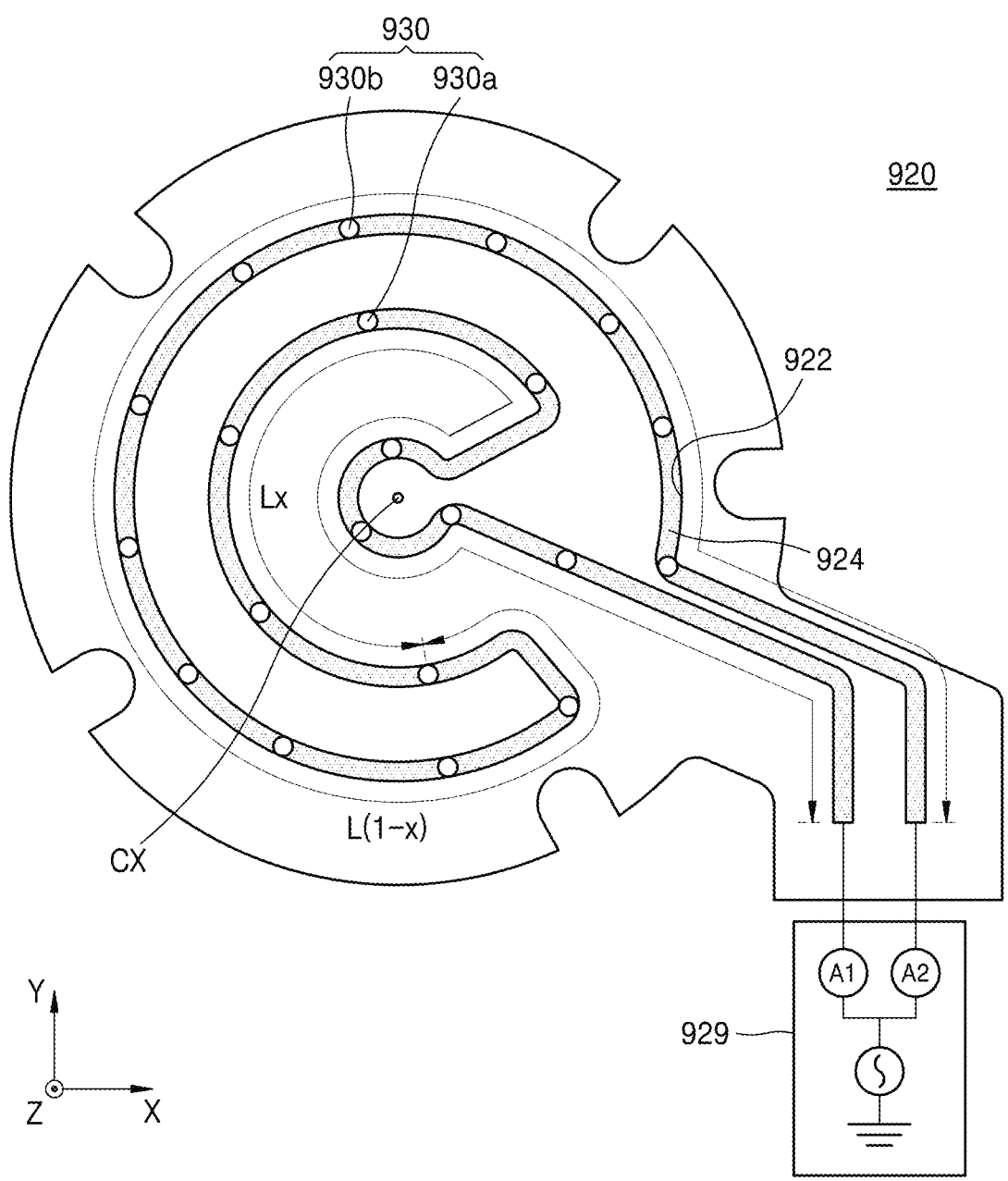
FIG. 7 is a plan view illustrating a lower plate of a substrate treating apparatus according to some embodiments.
Figure 8:
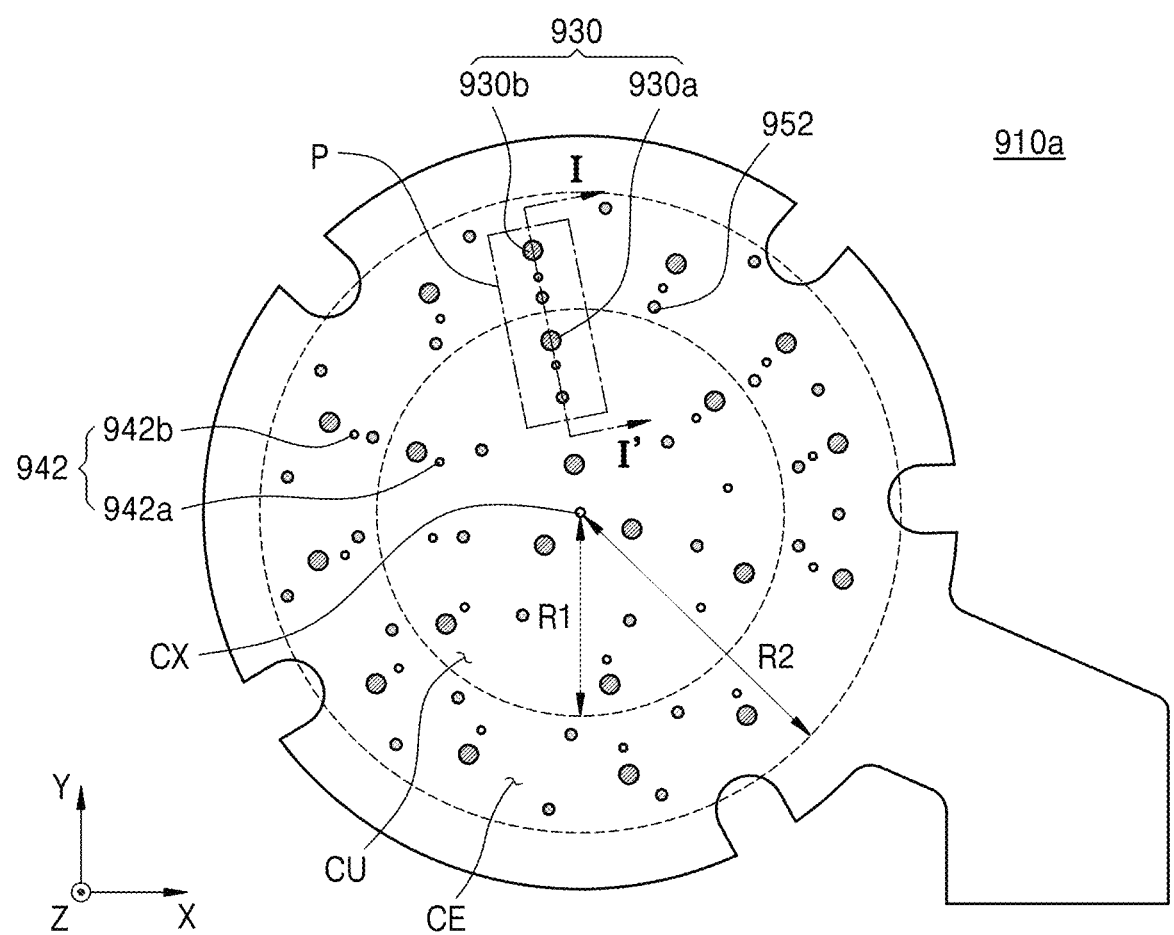
FIG. 8 is a plan view illustrating a first surface of a substrate treating apparatus according to some embodiments.
Figure 9:
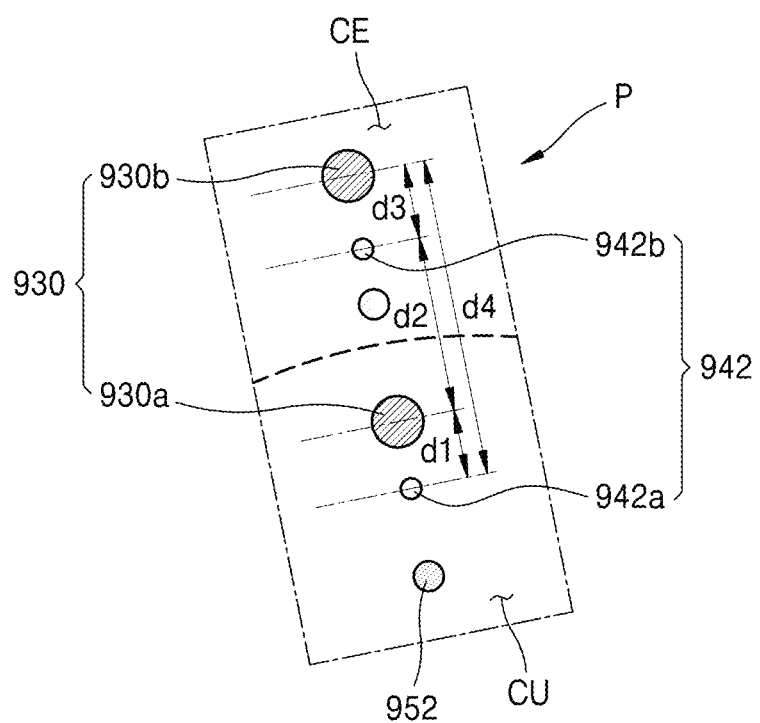
FIG. 9 is an enlarged view of region 'P' in FIG. 8.
Figure 10:
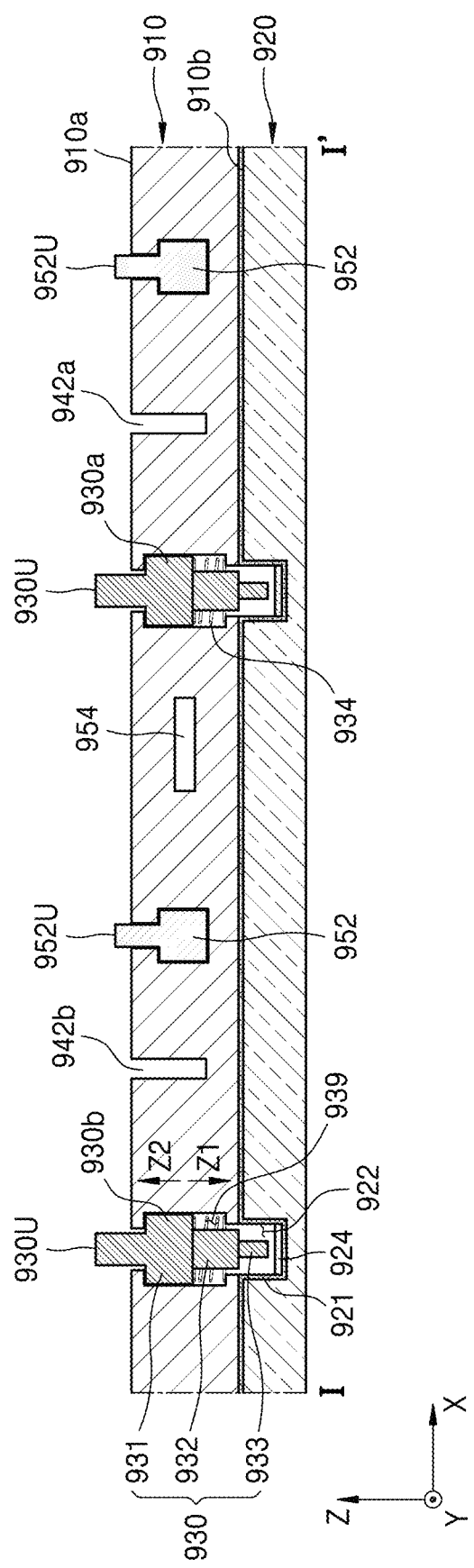
FIG. 10 is a cross-sectional view taken along line I-I' of the substrate treating apparatus of FIG. 8 according to some embodiments.

FIG. 4 is a perspective view illustrating the substrate treating apparatus 900 according to some embodiments. FIG. 5 is a perspective view illustrating a support plate 901 of the substrate treating apparatus 900 according to some embodiments. FIG. 6 is a plan view illustrating an upper plate 910 of the substrate treating apparatus 900 according to some embodiments. FIG. 7 is a plan view illustrating a lower plate 920 of the substrate treating apparatus 900 according to some embodiments. FIG. 8 is a plan view illustrating a first surface 910*a* of an upper plate 910 according to some embodiments. FIG. 9 is an enlarged view of region P in FIG. 8. FIG. 10 is a cross-sectional view taken along line I-I' of the substrate treating apparatus 900 having the plan view of FIG. 8 according to some embodiments.

Referring to FIGS. 4 to 10, the substrate treating apparatus 900 may include the support plate 901, a plurality of movable pins 930, a plurality of fixed pins 952, a conductive line 924, a sensor 929, and a controller 949.

According to embodiments, the support plate 901 may be configured to support the substrate S. The substrate S may be a semiconductor wafer. For example, the substrate S may include silicon (Si). The substrate S is a single element semiconductor, such as silicon (Si) or germanium (Ge) or a compound semiconductor, such as silicon germanium (SiGe), silicon carbide (SiC), indium arsenide (InAs), or indium phosphide (InP).

According to embodiments, the support plate 901 may include an upper plate 910 and a lower plate 920. For example, the upper plate 910 may include a first surface 910*a* facing the substrate and a second surface 910*b* opposing the first surface 910*a*. In this case, the lower plate 920 may be disposed on the second surface 910*b* of the upper plate 910. For example, the upper plate 910 may be bonded to the lower plate 920 through an adhesive material or a brazing technique.

According to embodiments, the support plate 901 may be configured to support the substrate S through a vacuum adsorption method. According to embodiments, the upper plate 910 may have a plurality of decompression holes 942 formed on the first surface 910*a*. According to embodiments, the upper plate 910 may include the decompression flow path 944 connected to a plurality of decompression holes 942 therein and configured to allow gas to flow. For example, the decompression flow path 944 may be connected to a decompression device 948.

According to embodiments, the decompression holes 942 may be connected to different decompression flow paths 944. For example, a first decompression hole 942*a* may be connected to a first decompression flow path 944*a*, and a second decompression hole 942*b* may be connected to a second decompression flow path 944*b*.

According to embodiments, the first decompression flow path 944*a* may not be connected to the second decompression flow path 944*b*. For example, the first decompression flow path 944*a* and the second decompression flow path 944*b* may be separately connected to a decompression device 948 and may not share a decompression flow path.

According to embodiments, the controller 949 may be configured to individually adjust pressure applied to the first decompression flow path 944*a* and the second decompression flow path 944*b*. For example, the controller 949 may adjust the decompression device 948. According to embodiments, the controller 949 may adjust the order of applying pressure to the first and second decompression flow paths 944*a* and 944*b*. For example, the controller 949 may apply reduced pressure to the second decompression flow path 944*b* after applying pressure to the first decompression flow path 944*a*, and conversely, may apply reduced pressure to the first decompression flow path 944*a* after applying pressure to the second decompression flow path 944*b*. For example, the controller 949 may simultaneously apply reduced pressure to the first decompression flow path 944*a* and the second decompression flow path 944*b*. Accordingly, the insides of the first decompression hole 942*a* and the second decompression hole 942*b* may be decompressed sequentially, in the opposite orders, or simultaneously.

According to embodiments, a plurality of pin holes 939 passing through the upper plate 910 in the vertical direction (e.g., the Z direction) and accommodating the movable pins 930 may be defined. According to embodiments, a portion of the movable pin 930 may be disposed within the pin hole 939. According to embodiments, another portion of the movable pin 930 may protrude from the first surface 910*a* of the upper plate 910.

According to embodiments, the movable pins 930 may be configured to move in the vertical direction (e.g., the Z direction). The Z direction may include a first direction Z1 and a second direction Z2 opposite to the first direction Z1. According to embodiments, the movable pin 930 may include an elastic member 934 configured to apply an elastic force to the movable pin 930 in the second direction Z2. For example, the second direction may be a direction in which an upper surface 930U of the movable pin 930 is away from the first surface 910*a* of the upper plate 910. According to embodiments, when the substrate S is seated on the support plate 901, the movable pins 930 may be pressed by a load of the substrate S or pressure-sensitive adsorption with respect to the substrate S and may move in the first direction Z1. For example, the first direction Z1 may be a direction opposite to the elastic force, and may be a direction in which the upper surface 930U of the movable pin 930 approaches the first surface 910*a* of the upper plate 910. For example, the elastic member 934 may be a compression spring, a tension spring, or an elastomer, but is not limited thereto. For example, the elastic member 934 may be a coil spring, an air spring, a tension spring, or a leaf spring.

According to embodiments, the fixed pins 952 may partially pass through the upper plate 910 and protrude from the first surface 910*a* of the upper plate 910. For example, the fixed pin 952 may be buried in the upper plate 910, and a portion of the fixed pin 952 may pass through the upper plate 910 and protrude from the first surface 910*a*. According to embodiments, the fixed pins 952 may be integral with the upper plate 910. For example, the fixed pins 952 may be portions of the upper plate 910 protruding from the first surface 910*a* of the upper plate 910.

According to embodiments, upper surfaces 952U of the fixed pins 952 may be vertically positioned at a level lower than the upper surfaces 930U of the movable pins 930. In some embodiments, when the substrate S is not disposed on the movable pins 930, the upper surfaces 930U of the movable pins 930 may be vertically further away from the first surface 910*a* of the upper plate 910 than the upper surfaces 952U of the fixed pins 952.

For example, in the process of seating the substrate S on the support plate 901, the movable pins 930 may move in the first direction Z1 as they are pressed by the substrate S. In this case, the upper surfaces 930U of the movable pins 930 may be vertically close to the upper surfaces 952U of the fixed pins 952. For example, the substrate S may be supported by the movable pins 930 and the fixed pins 952. For example, the substrate S may be seated on the support plate 901, while contacting the upper surfaces 952U of the fixed pins 952 and the upper surfaces 930U of the movable pins 930. In this case, the substrate S may not directly contact the first surface 910a of the upper plate 910 and may be supported to be apart from the first surface 910a by a certain distance.

According to embodiments, the movable pins 930, the fixed pins 952, and the decompression holes 942 may be arranged to be substantially uniformly distributed on the first surface 910a of the upper plate 910 with respect to a central axis CS of the support plate 901. According to embodiments, the movable pins 930, the fixed pins 952, and the decompression holes 942 may be arranged radially symmetrically on the first surface 910a of the upper plate 910 with respect to the central axis CS of the support plate 901.

In some embodiments, the movable pin 930, the fixed pin 952, and the decompression hole 942 may be disposed adjacent to each other as a group. The movable pins 930, the fixed pins 952, and the decompression holes 942 may form a plurality of groups, and the groups may be arranged to be apart from each other by a certain distance on the first surface 910a.

According to embodiments, the support plate 901 may include a line tunnel 922 connected to the pin holes 939. According to embodiments, the line tunnel 922 may be a space defined by the upper plate 910 and the lower plate 920.

In some embodiments, the lower plate 920 may have a trench line connecting points vertically overlapping the movable pins 930 on a surface in contact with the second surface 910b of the upper plate 910. In this case, the line tunnel 922 may be formed by bonding the upper plate 910 to the lower plate 920 in the second surface 910b.

In some other embodiments, the upper plate 910 may have a trench line that passes through the upper plate 910 and connects points vertically overlapping the movable pins 930, on the second surface 910b. In this case, the upper plate 910 may be bonded to the lower plate 920 in the second surface 910b to form the line tunnel 922.

In some other embodiments, the trench line may be formed on each of the second surface 910b of the upper plate 910 and one surface of the lower plate 920 contacting the second surface 910b of the upper plate 910. In this case, the line tunnel 922 may be formed by bonding the upper plate 910 to the lower plate 920.

For example, portions of the line tunnel 922 that vertically overlap the movable pins 930 may be vertically connected to the pin holes 939. According to embodiments, the pin holes 939 may have a shape partially passing through the lower plate 920. In some embodiments, a portion of the movable pins 930 may be located in the line tunnel 922.

According to embodiments, the conductive line 924 may extend within the line tunnel 922 along the line tunnel 922. For example, the line tunnel 922 may have an Eulerian trail shape that connects the pin holes 939 only once, and the conductive line 924 may not include a disconnected portion or an overlapping portion. In some embodiments, line tunnel 922 may connect all pin holes 939 formed in support plate 901. In some other embodiments, the line tunnel 922 may connect only some of the pin holes 939 formed in the support plate 901. According to embodiments, the conductive line 924 may include a carbon material. For example, conductive line 924 may be a polymer including a conductive carbon-based filler.

According to embodiments, the movable pins 930 may contact the conductive line 924 as they move in the first direction Z1. In some embodiments, when the substrate S is not supported on the support plate 901, the movable pins 930 may not contact the conductive line 924. For example, the movable pins 930 may be vertically apart from the conductive line 924 by elastic force of the elastic member 934 in the second direction Z2. In some embodiments, when the substrate S is supported on the support plate 901, the movable pins 930 may move in the first direction Z1, and thus, contact the conductive line 924, as described above.

According to embodiments, the conductive line 924 may be insulated from the support plate 901. According to embodiments, an insulating layer 921 may be located between the conductive line 924 and the support plate 901. For example, an insulating material may be conformally applied on the lower plate 920 having a trench shape to form the insulating layer 921. For example, the conductive line 924 may be disposed on the insulating layer 921 in a space defined by the trench.

According to embodiments, the movable pin 930 may include a head portion 931 configured to support the substrate S, a tail portion 933 configured to contact the conductive line 924, and a body portion 932 between the head portion 931 and the tail portion 933.

According to embodiments, the head portion 931 and the tail portion 933 may include a conductive material. For example, at least one of the head portion 931 and the tail portion 933 may include a conductive polymer. In some embodiments, the conductive polymer may include polyetheretherketone (PEEK) including a conductive carbon-based filler. For example, the carbon-based filler may include carbon black, carbon fiber, carbon nanotube, and the like.

According to embodiments, the body portion 932 may include a dielectric material. For example, the body portion 932 may include a polyester-based resin, such as polyethylene terephthalate, polyethylene isophthalate, polyethylene naphthalate, or polybutylene terephthalate; a cellulosic resin, such as diacetyl cellulose and triacetyl cellulose; a polycarbonate-based resin; an acrylic resin, such as polymethyl (meth) acrylate and polyethyl (meth) acrylate, or combinations thereof. For example, the body portion 932 may include ceramics, such as aluminum nitride (AlN), aluminum oxide ($Al_2O_3$), titanium nitride (TiN), titanium oxide (TiO), and silicon carbide (SiC) or combinations thereof.

According to embodiments, the sensor 929 may be configured to detect a contact position between the conductive line 924 and the movable pin 930. According to embodiments, the sensor 929 may be configured to detect a contact position of the movable pin 930 that first contacts the conductive line 924, among the movable pins 930. According to embodiments, the contact position of the movable pin 930 in contact with the conductive line 924 in a horizontal direction (e.g., an X direction and/or a Y direction) may be sensed by a touch sensing method. According to embodiments, the sensor 929 may include an ammeter connected to both ends of the conductive line 924, and may be configured to apply a power supply voltage and a ground voltage to the conductive line 924. For example, when the movable pin 930 contacts the conductive line 924 through which current flows, a resistance value between the contact point and both ends of the conductive line 924 may change. For example, movable pin 930 may perform a function similar to that of a capacitor. For example, the amount of change in resistance may be measured by the ammeter, and a certain contact point for a length L of the conductive line 924 may be designated as Lx ($0 \leq x \leq 1$). Accordingly, the sensor 929 may detect the contact point between the movable pin 930 and the conductive line 924, and may determine the position of the movable pin 930 that first contacts the conductive line 924, among the movable pins 930.

When the warped substrate S is seated on the support plate 901, the movable pins 930 may not contact the substrate S at the same time in a plan view. For example, the substrate S having a shape convex upwardly with respect to the first surface 910a of the upper plate 910 may first come into contact with the movable pins 930 located at an edge portion. Thereafter, as the substrate S is deformed and/or the movable pins 930 located at the edge portion move in the first direction Z1, the substrate S may come into contact with the movable pins 930 located in the center portion. Conversely, the substrate S having an upwardly convex shape with respect to the first surface 910a of the upper plate 910 may first come into contact with the movable pins 930 located in the center portion, and then, as the substrate S is deformed and/or the movable pins 930 located in the center portion move in the first direction Z1, the substrate S may come into contact with the movable pins 930 located at the edge portion.

When decompression (or pressure reduction) is simultaneously applied to all of the decompression holes 942 regardless of positions in a plan view without considering warping of the warped substrate S, the substrate S may be damaged. In the substrate treating apparatus 900 according to embodiments of the disclosure, the decompression order may be changed according to a planar position of the first surface 910a of the upper plate 910 according to the warped aspect of the substrate S. Accordingly, cracks or breakage of the substrate S may be prevented, and the yield of the semiconductor manufacturing process may be improved.

According to embodiments, a first contact pin which is selected from the plurality of movable pins 930 and first contacts the substrate S is defined. According to embodiments, the warped aspect of the substrate S and the position of the first contact pin may be sensed as the plurality of movable pins 930 are pressed by the substrate S and moved in the first direction Z1 to contact the conductive line 924. In this case, the decompression holes 942 may be decompressed in a different order according to the position of the plurality of movable pins 930 that contact the conductive line 924.

According to embodiments, the order in which the controller 949 applies decompression to the first decompression flow path 944a and the second decompression flow path 944b may be determined by distances between the movable pin 930 that first contacts the conductive line 924, among the movable pins 930, and the first decompression hole 942a and the second decompression hole 942b. For example, the order in which the controller 949 applies decompression to the first decompression flow path 944a and the second decompression flow path 944b may be determined by a distance between the first contact pin and the first decompression hole 942a and a distance between the first contact pin and the second decompression hole 942b. For example, the movable pin 930 that first contacts the conductive line 924, among the movable pins 930, that is, the contact pin, may be determined by the sensor 929. According to embodiments, the movable pins 930 may include a first movable pin 930a adjacent to the first decompression hole 924a and a second movable pin 930b adjacent to the second decompression hole 924b. In some embodiments, when the first movable pin 930a, among the movable pins 930, contacts the conductive line 924 first in the process of seating the substrate S, the controller 949 may apply decompression to the first decompression flow path 944a and then apply decompression to the second decompression flow path 944b. In some embodiments, when the second movable pin 930b contacts the conductive line 924 first, the controller 949 may apply decompression to the second decompression flow path 944b and then apply decompression to the first decompression flow path 944a.

According to embodiments, the first surface 910a of the upper plate 910 may include a center portion CU and an edge portion EU. In some embodiments, a horizontal area of the center portion CU may be equal to a horizontal area of the edge portion EU. In some embodiments, a distance R1 from the central axis CX of the support plate 901 to a boundary of the center portion CU may be half of a distance R2 from the central axis CX of the support plate 901 to a boundary of the edge portion EU. For example, the center portion CU and the edge portion EU may have concentric circle shapes.

According to embodiments, the first movable pins 930a and the first decompression holes 942a may be arranged in the center portion CU, and the second movable pins 930b and the second decompression holes 942b may be arranged at the edge portion EU. In some embodiments, the number of first movable pins 930a in the center portion CU may be the same as the number of second movable pins 930b at the edge portion EU.

According to embodiments, the first decompression flow path 944a may connect a plurality of first decompression holes 942a arranged in the center portion CU, and the second decompression flow path 944b may connect a plurality of second decompression holes 942b disposed at the edge portion EU. For example, as the first decompression flow path 944a is decompressed, adsorption to the substrate S may be performed in the center portion CU. For example, as the second decompression flow path 944b is decompressed, adsorption to the substrate S may be performed at the edge portion EU.

In some embodiments, a distance d1 between the first movable pin 930a and the first decompression hole 942a may be shorter than a distance d2 between the first movable pin 930a and the second decompression hole 942b. In some embodiments, a distance d3 between the second movable pin 930b and the second decompression hole 942b may be shorter than a distance d4 between the second movable pin 930b and the first decompression hole 942a. For example, the decompression hole 942 closest to the first movable pin 930a may be the first decompression hole 942a, and the decompression hole 942 closest to the second movable pin 930b may be the second decompression hole 942b. Accordingly, sequential decompression for the divided regions (e.g., the center portion CU and the edge portion EU) may be performed more accurately.

According to embodiments, the substrate treating apparatus 900 may further include the cooling flow path 954 configured to cool the substrate S. For example, both ends 955a and 955b of the cooling flow path 954 may be an inlet and an outlet, respectively, and may be configured to receive and discharge cooling fluid, respectively. For example, circulation of cooling fluid may be regulated via a cooling fluid controller 956.

According to embodiments, the cooling flow path 954 may be formed in the upper plate 910. According to embodiments, the cooling flow path 954 may include a first cooling flow path 954a, a second cooling flow path 954b, and a third cooling flow path 954c arranged in a shape similar to the concentric circle of the upper plate 910 sharing the central axis CX. For example, the first cooling flow path 954a, the second cooling flow path 954b, and the third cooling flow path 954c may be arranged in order close to the central axis CX of the upper plate 910.

According to embodiments, the first decompression flow path 944a may be located between the first cooling flow path 954a and the second cooling flow path 954b, and the second decompression flow path 944b may be disposed between the second cooling flow path 954b and the third cooling flow path 954c. According to embodiments, the first decompression flow path 944a and the second decompression flow path 944b may share the central axis CX and may have concentric circles separated from each other.

Figure 11:
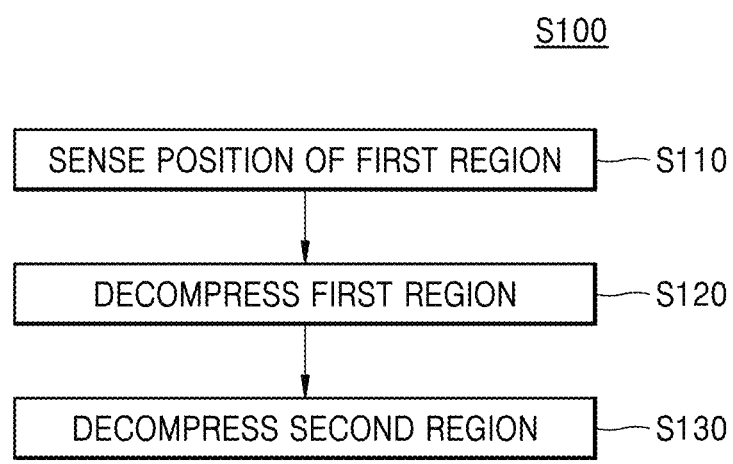
FIG. 11 is a flowchart illustrating a substrate treating method according to some embodiments.

Hereinafter, a substrate treating method (S100) according to embodiments of the disclosure is described. FIG. 11 is a flowchart illustrating the substrate treating method S100 according to some embodiments. From a structural point of view, descriptions that may be understood through the substrate treating apparatus 900 described above or that are redundant may be omitted.

Figure 12A:
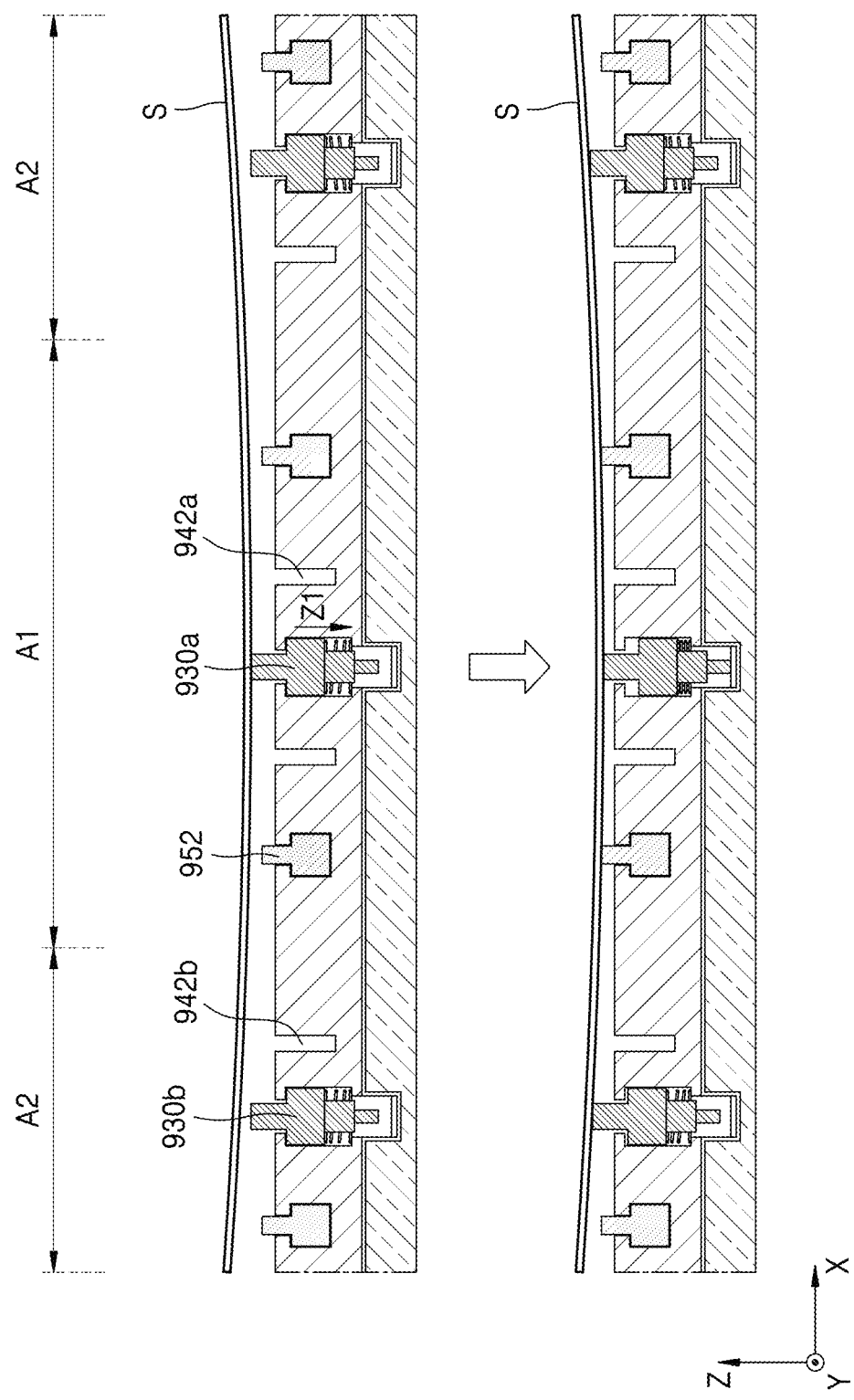
FIG. 12A is a cross-sectional view illustrating a process of supporting a warped substrate that is concave downwardly, by a substrate treating apparatus according to some embodiments.
Figure 12B:
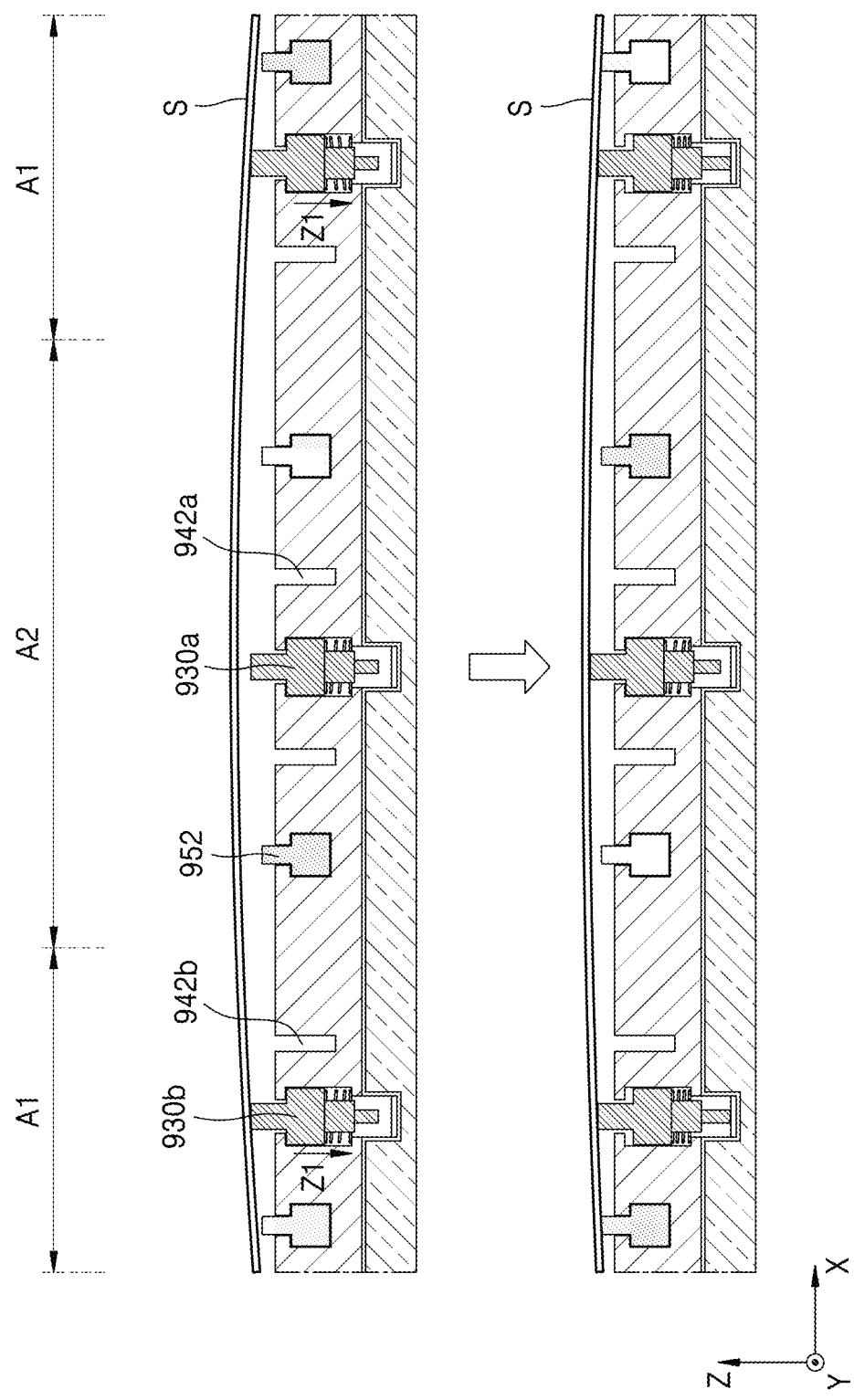
FIG. 12B is a cross-sectional view illustrating a process of supporting a warped substrate that is convex upwardly by a substrate treating apparatus according to some embodiments.

FIG. 12A is a cross-sectional view illustrating a process of supporting the substrate S warped to be concave downwardly by the substrate treating apparatus 900 according to some embodiments. FIG. 12B is a cross-sectional view illustrating a process of supporting the substrate S warped to be convex upwardly by the substrate treating apparatus 900 according to some embodiments. In FIGS. 12A and 12B, the substrate treating apparatus 900 is shown as including three movable pins 930, four fixed pins 952, and four decompression holes 942, but this is briefly expressed for description and the disclosure is not limited thereto.

The substrate treating method (S100) according to embodiments of the disclosure may include an operation (e.g., S110) of sensing a position of a first region A1, which is a portion of the support plate 901 that first comes into contact with the substrate S. According to embodiments, the warped substrate S may first contact some of the movable pins 930 protruding from the first surface 910a of the upper plate 910 in the first region A1. In this case, the movable pins 930 arranged in a second region A2 other than the first region A1 may not contact the substrate S. According to embodiments, the movable pins 930 arranged in the first region A1 may move in the first direction Z1 as the movable pins 930 arranged in the first region A1 are pressed by a load of the substrate S. According to embodiments, the movable pin 930 moving in the first direction Z1 may come into contact with the conductive line 924. In this case, a position of the first region A1 may be sensed by the sensor 929. For example, the sensor 929 may sense a contact point between the movable pin 930 and the conductive line 924, and accordingly, sense the position of the first region A1.

According to embodiments, the substrate treating method (S100) may include operation (S120) of decompressing the first region A1 and operation (S130) of decompressing regions other than the first region A1. For example, the first region A1 and the second region A2 may be sequentially decompressed. Accordingly, it is possible to prevent a portion of the warped substrate S that is far from the first surface 910a of the upper plate 910 from being suddenly supported on the second region A2 of the support plate 901.

According to embodiments, as decompression is performed on the first region A1, the movable pins 930 of the first region A1 may move in the first direction Z1. In this case, the substrate S may be supported by the fixed pins 952 of the first region A1. According to embodiments, as decompression is performed on the second region A2, the movable pins 930 and the fixed pins 952 of the second region A2 may sequentially come into contact with the substrate S. In some other embodiments, among the fixed pins, the fixed pins 952 adjacent to the first region A1 may contact the substrate S before the movable pins 930 of the second region A2.

According to embodiments, the operation (S120) of decompressing the first region A1 and the operation (S130) of decompressing the second region A2 may be performed at intervals of 0.05 seconds to 1 second.

Referring to FIG. 12A, the warped substrate S may be concave downwardly with respect to a surface parallel to the upper surface of the support plate 901 (e.g., the first surface 910a of the upper plate 910).

According to embodiments, when the substrate S is seated on the upper surface of the support plate 901, the first movable pin 930a located in the center portion CU may first contact the substrate S before the second movable pin 930a located in the center portion CU. For example, the first region A1 may be the center portion CU.

According to embodiments, the first movable pin 930a may move in the first direction Z1 under the load of the substrate S, and may contact the conductive line 924 before the second movable pin 930b. Accordingly, the shape of the downwardly concave substrate S may be sensed, and decompression may be sequentially applied to the first decompression hole 942a in the center portion CU and the second decompression hole 942b at the edge portion EU.

Referring to FIG. 12B, the warped substrate S may be convex upwardly with respect to a surface parallel to the upper surface of the support plate 901 (e.g., the first surface 910a of the upper plate 910).

According to embodiments, when the substrate S is seated on the upper surface of the support plate 901, the second movable pin 930b located at the edge portion EU may first contact the substrate S before the first movable pin 930a located in the center portion CU. In this case, the first region A1 may be the edge portion EU, and the second region A2 may be the center portion CU.

According to embodiments, the second movable pin 930b may move in the first direction Z1 under the load of the substrate S, and may contact the conductive line 924 before the first movable pin 930a. Accordingly, a shape of the upwardly convex substrate S may be sensed. According to embodiments, the decompression may be first applied to the second decompression hole 942b at the edge portion EU and then decompression may be applied to the first decompression hole 942a in the center portion CU.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:
1. A substrate treating apparatus comprising:
a support plate having a first decompression hole and a second decompression hole in a first surface facing a substrate and including a first decompression flow path connected to the first decompression hole and a second decompression flow path connected to the second decompression hole;

a plurality of movable pins protruding from the first surface of the support plate and configured to contact a conductive line according to movement in a first direction; and a controller configured to adjust an order of decompressing the first decompression flow path and the second decompression flow path, wherein the controller is further configured to determine the order of decompressing the first decompression flow path and the second decompression flow path according to a distance between the first decompression hole and a first contact pin which is selected from the plurality of movable pins and comes into contact with the conductive line first and a distance between the second decompression hole and the first contact pin.

2. The substrate treating apparatus of claim 1, wherein the first decompression flow path is separated from the second decompression flow path.

3. The substrate treating apparatus of claim 1, further comprising:
a plurality of pin holes passing through a portion of the support plate and accommodating the plurality of movable pins; and
a line tunnel connected to the plurality of pin holes, wherein the conductive line extends within the line tunnel.

4. The substrate treating apparatus of claim 1, wherein the conductive line is insulated from the support plate.

5. The substrate treating apparatus of claim 1, wherein a position of the first contact pin that comes into contact with the conductive line first, from among the plurality of movable pins, is specified by a capacitive touch sensing method.

6. The substrate treating apparatus of claim 1, wherein each of the plurality of movable pins includes:
a head portion configured to support the substrate;
a tail portion configured to contact the conductive line according to the movement in the first direction; and
a body portion between the head portion and the tail portion,
wherein each of the head portion and the tail portion includes a conductive material, and the body portion includes a dielectric material.

7. The substrate treating apparatus of claim 6, wherein at least one of the head portion and the tail portion further includes polyether ether ketone including a conductive carbon-based filler.

8. The substrate treating apparatus of claim 1, wherein the plurality of movable pins further include an elastic member configured to apply elastic force in a direction opposite to the first direction.

9. The substrate treating apparatus of claim 1, further comprising a plurality of fixed pins protruding from the first surface of the support plate and configured to support the substrate.

10. The substrate treating apparatus of claim 1, wherein the support plate further includes a cooling flow path therein.

11. A substrate treating apparatus comprising:
an upper plate including a first surface facing a substrate and including a center portion and an edge portion and a second surface opposite to the first surface, having a first decompression hole and a first pin hole in the center portion of the first surface, and having a second decompression hole and a second pin hole at the edge portion of the first surface;

a lower plate disposed on the second surface of the upper plate and defining a line tunnel connecting the first pin hole to the second pin hole together with the upper plate;

a first movable pin located in the first pin hole, protruding from the first surface, and configured to move in a first direction;

a second movable pin located in the second pin hole, protruding from the first surface, and configured to move in the first direction;

a plurality of fixed pins protruding from the first surface;

a conductive line located in the line tunnel and configured to contact the first and second movable pins according to movement of the first and second movable pins in the first direction;

a sensor configured to sense a contact order of the first movable pin with the conductive line and the second movable pin with the conductive line; and a controller configured to adjust a decompression order of the first decompression hole and the second decompression hole according to a contact order of the first movable pin and the second movable pin with the conductive line.

12. The substrate treating apparatus of claim 11, wherein the upper plate further includes a first decompression flow path connected to the first decompression hole and a second decompression flow path connected to the second decompression hole,
the first decompression flow path is separated from the second decompression flow path, and
the first decompression flow path and the second decompression flow path are individually decompressed by the controller.

13. The substrate treating apparatus of claim 11, further comprising an insulating layer disposed between the upper plate and the lower plate.

14. The substrate treating apparatus of claim 11, wherein upper surfaces of the first movable pin and the second movable pin are farther from the first surface of the upper plate than upper surfaces of the plurality of fixed pins.

15. A substrate treating method comprising:
sensing a position of a first region, which is a portion of a support plate that first comes into contact with a substrate; and
applying a first pressure to decompress the first region; and
applying a second pressure to decompress a second region other than the first region after decompressing the first region,
wherein the sensing position of the first region includes moving a movable pin of the first region in a first direction, while supporting the substrate,
contacting the movable pin with a conductive line, and determining a position of the first region by sensing a contact point at which the movable pin contacts the conductive line.

16. The substrate treating method of claim 15, further comprising supporting the substrate by a fixed pin as the movable pin moves in the first direction.

17. The substrate treating method of claim 15, wherein a time interval between a time point of decompressing the first region and a time point of decompressing the second region ranges from about 0.05 seconds to about 1 second.

18. The substrate treating method of claim 15, wherein the substrate is upwardly convex with respect to a surface parallel to an upper surface of the support plate, and the first region is an edge portion of the support plate.

19. The substrate treating method of claim 15, wherein the substrate is downwardly convex with respect to a surface parallel to an upper surface of the support plate, and the first region is a center portion of the support plate.

* * * * *